(12) United States Patent  (10) Patent No.: US 7,940,579 B2
Fujiu  (45) Date of Patent: May 10, 2011

(54) SEMICONDUCTOR INTEGRATED CIRCUIT DEVICE

(75) Inventor: Masaki Fujiu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 204 days.

(21) Appl. No.: 12/332,688

(22) Filed: Dec. 11, 2008

(65) Prior Publication Data

US 2009/0147595 A1  Jun. 11, 2009

(30) Foreign Application Priority Data

Dec. 11, 2007 (JP) ................................. 2007-319707

(51) Int. Cl.
*G11C 5/14* (2006.01)

(52) U.S. Cl. ............. 365/189.09; 365/226; 365/189.11; 365/185.22; 365/185.24

(58) Field of Classification Search ............. 365/189.09, 365/226, 189.11, 185.22, 185.24
See application file for complete search history.

(56) References Cited

U.S. PATENT DOCUMENTS

| | | | | |
|---|---|---|---|---|
| 5,487,036 A * | 1/1996 | Akaogi et al. | ........... | 365/189.09 |
| 5,515,324 A * | 5/1996 | Tanaka | ...................... | 365/185.09 |
| 5,844,842 A * | 12/1998 | Seki et al. | ................ | 365/185.24 |
| 5,991,221 A * | 11/1999 | Ishikawa et al. | .............. | 365/226 |
| 6,222,779 B1 * | 4/2001 | Saito et al. | ............... | 365/189.09 |
| 6,278,639 B1 * | 8/2001 | Hosono et al. | ........... | 365/189.09 |
| 6,356,499 B1 * | 3/2002 | Banba et al. | ................... | 365/226 |
| 6,404,274 B1 * | 6/2002 | Hosono et al. | ................ | 327/538 |
| 6,418,065 B2 * | 7/2002 | Sato et al. | ................ | 365/189.11 |
| 6,434,080 B1 * | 8/2002 | Shiga | ....................... | 365/230.08 |
| 6,542,411 B2 * | 4/2003 | Tanikawa et al. | ........ | 365/185.33 |
| 6,600,692 B2 * | 7/2003 | Tanzawa | ....................... | 365/226 |
| 7,542,361 B2 * | 6/2009 | Sato | ............................. | 365/205 |
| 2003/0058692 A1 | 3/2003 | Shiga | | |

* cited by examiner

*Primary Examiner* — Viet Q Nguyen

(74) *Attorney, Agent, or Firm* — Oblon, Spivak, McClelland, Maier & Neustadt, L.L.P.

(57) ABSTRACT

A semiconductor integrated circuit device includes: a memory cell array composed of electrically rewritable memory cells; an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage; a control circuit for controlling the internal voltage generating circuit; and a writing circuit for applying the internal voltage to the memory cell as a writing voltage when writing data into the memory cell, wherein the control circuit controls the internal voltage to a first voltage necessary for writing data into the memory cell when writing data into the memory cell, and to a second voltage lower than the first voltage in a write verify operation following the data write operation.

17 Claims, 9 Drawing Sheets

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2007-319707, filed on Dec. 11, 2007, the entire contents of which are incorporated herein by reference.

BACKGROUND OF THE INVENTION

1. Field of the Invention

The present invention relates to a semiconductor integrated circuit device, and more particularly to a semiconductor integrated circuit device such as a nonvolatile semiconductor memory device having a boosting circuit for generating an internal voltage by boosting a supply voltage.

2. Description of the Related Art

In a nonvolatile semiconductor memory device such as NAND type flash memory, an internal voltage generating circuit is provided because an internal voltage higher than the supply voltage is needed in data writing and erasing operation. This internal voltage generating circuit includes a boosting circuit for boosting the supply voltage to a required internal voltage, and a voltage detecting circuit. The voltage detecting circuit compares the monitor voltage obtained by dividing the output voltage of the boosting circuit with a specified reference voltage in a comparative amplifier, and feeds back the detection output of the result to the boosting circuit. The detection output of the voltage detecting circuit is a signal for controlling the boosting circuit to start/stop the boosting operation of the supply voltage, and is used for maintaining the output voltage of the boosting circuit at a specified internal voltage level. In a general conventional NAND type flash memory, during writing sequence operation, the output voltage of the boosting circuit is always held higher than the writing voltage level (see, for example, patent document 1: Japanese Patent Application Laid-Open No. 11-353889).

However, the writing sequence operation includes a write operation and a write verify operation, and the writing voltage is actually used in the write operation only among the writing sequence operation. Therefore, maintaining such high voltage in the boosting circuit means continuous flowing of current in the voltage detecting circuit, which may lead to increase of current consumption. Especially, when multiple values are stored for setting a plurality of threshold levels in one memory cell, the write verify operation is repeated plural times for one write operation, and thus the write verify time is very long, and the wasteful consumption of power spent during this period cannot be ignored.

To solve the problem, a prior art has been disclosed in patent document 2 (Japanese Patent Application Laid-Open No. 2007-80478).

This prior art has a plurality of switching elements provided in a current passage in the boosting circuit and voltage detecting circuit for activating or inactivating the boosting circuit and voltage detecting circuit. In the write verify operation, these switching elements are turned off, whereby the boosting circuit and the voltage detecting circuit are inactivated, so that the current consumption is curtailed.

SUMMARY OF THE INVENTION

A semiconductor integrated circuit device according to one aspect of the present invention includes: a memory cell array composed of electrically rewritable memory cells; an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage; a control circuit for controlling the internal voltage generating circuit; and a writing circuit for applying the internal voltage to the memory cell as a writing voltage when writing data into the memory cell, wherein the control circuit controls the internal voltage to a first voltage necessary for writing data into the memory cell when writing data into the memory cell, and to a second voltage lower than the first voltage in a write verify operation following the data write operation.

A semiconductor integrated circuit device according to another aspect of the present invention includes: a memory cell array composed of electrically rewritable memory cells; an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage; a control circuit for controlling the internal voltage generating circuit; and a writing circuit for applying the internal voltage to the memory cell as a writing voltage when writing data into the memory cell, wherein the control circuit activates the internal voltage generating circuit from start till end of data writing into the memory cell, and controls the internal voltage to a first voltage necessary for writing data into the memory cell, and to a second voltage lower than the first voltage in a write verify operation following the data write operation.

A semiconductor integrated circuit device according to still another aspect of the present invention includes: a memory cell array composed of a plurality of memory cells electrically rewritable and capable of storing multilevel data according to a difference in a threshold voltage; an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage; a control circuit for controlling the internal voltage generating circuit; and a writing circuit for applying the internal voltage to the memory cell as a writing voltage when writing data into the memory cell, wherein the control circuit controls the internal voltage to a first voltage necessary for writing data into the memory cell when writing data into the memory cell, and to a second voltage lower than the first voltage in a write verify operation following the data write operation.

DETAILED DESCRIPTION OF THE EMBODIMENTS

Figure 1:
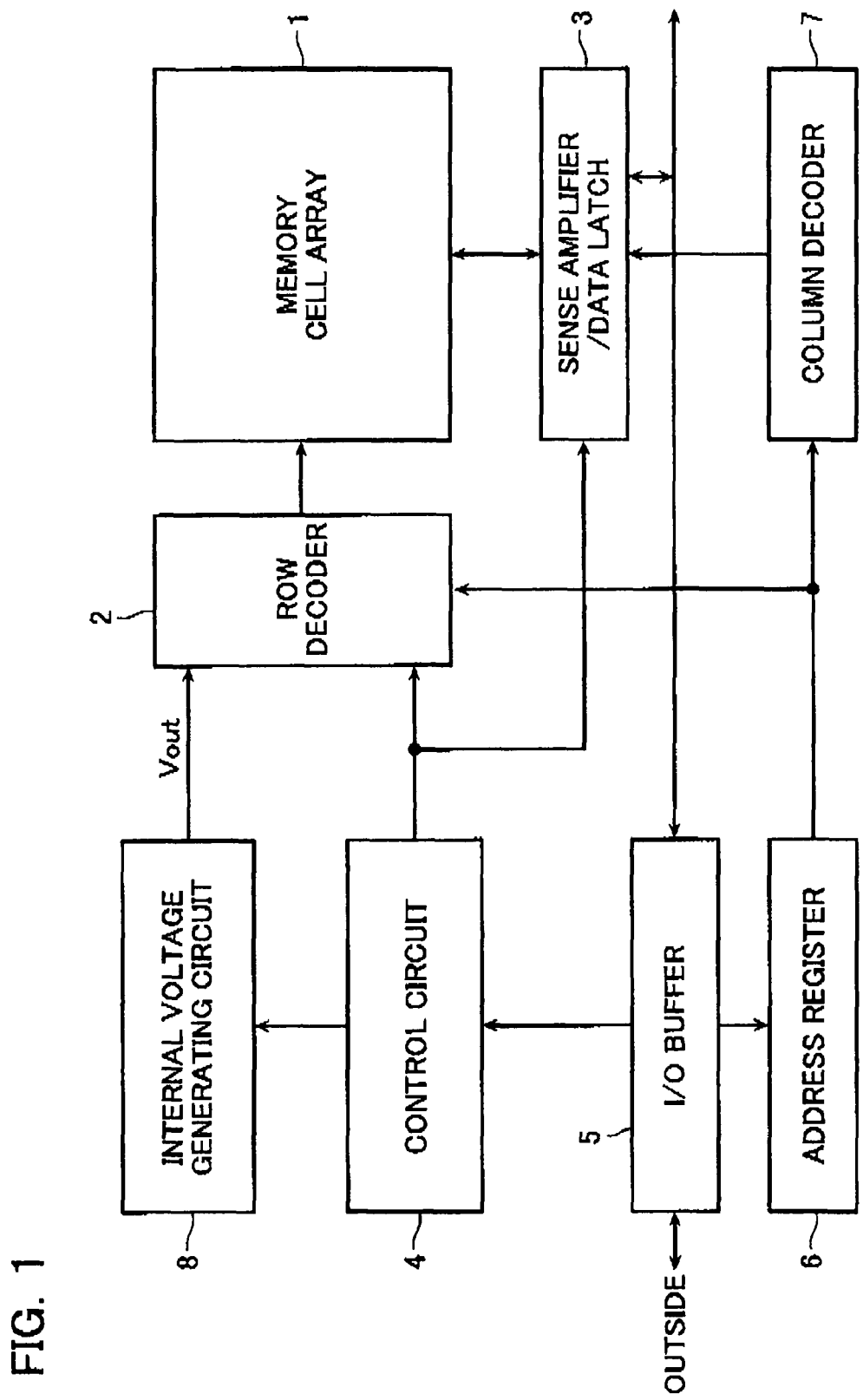
FIG. 1 is a functional block diagram of a NAND type flash memory according to a first embodiment.

Referring now to the drawings, embodiments of a semiconductor integrated circuit device according to the invention will be specifically described below.

First Embodiment

Figure 2:
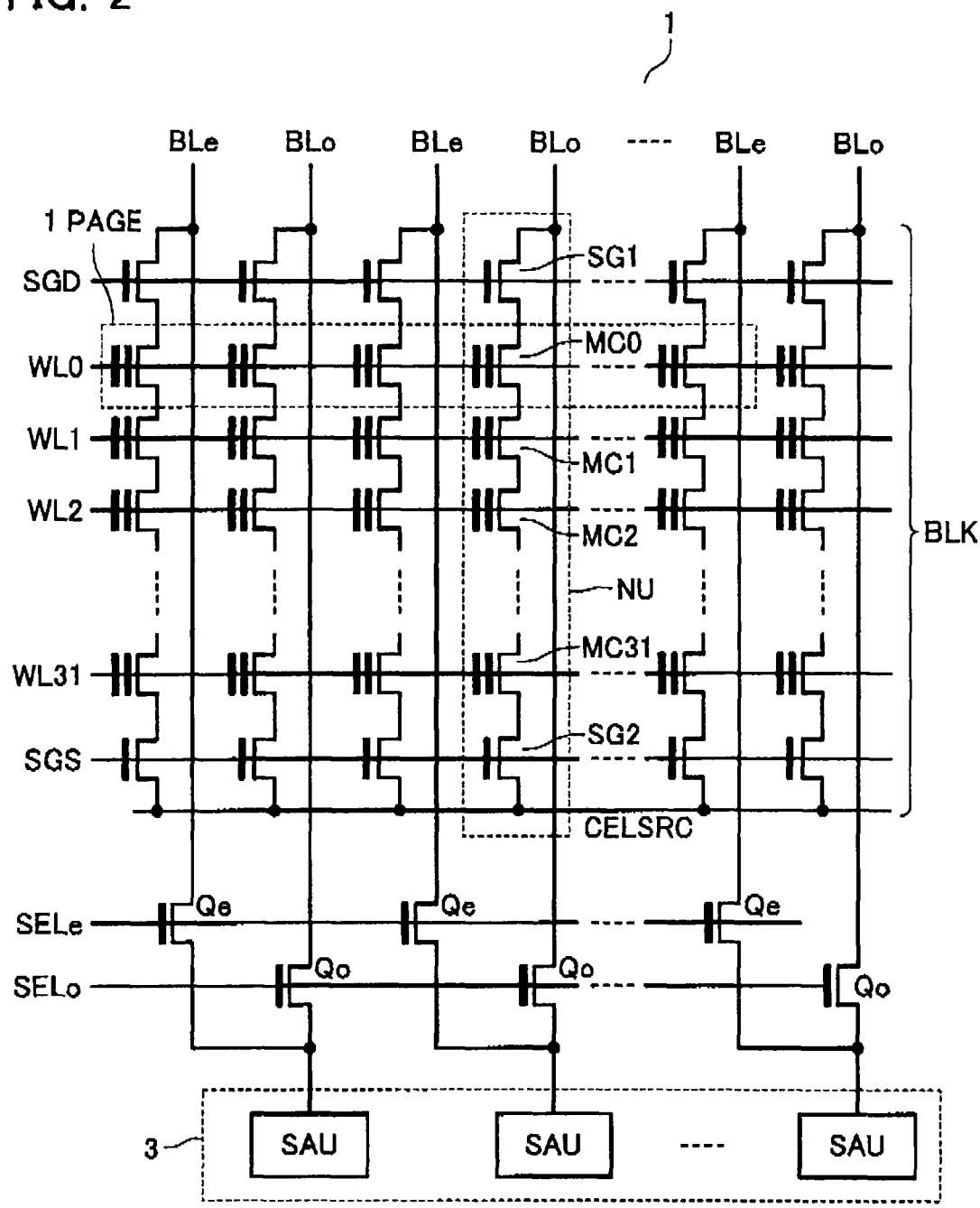
FIG. 2 is a structural diagram of a memory cell array of the NAND type flash memory.

FIG. 1 shows a functional block structure of a NAND type flash memory according to a first embodiment of the invention, and FIG. 2 shows a structure of a memory cell array 1 shown in FIG. 1. As shown in FIG. 2, the memory cell array 1 is composed by arraying NAND cell units NU. Each NAND cell unit NU has a plurality of (32 in the example in FIG. 2) nonvolatile memory cells MC0 to MC31 rewritable electrically and connected serially, a first selection gate transistor SG1 for connecting bit line BL to one end of the serial connection of the memory cells MC0 to MC31, and a second selection gate transistor SG2 for connecting source line CELSRC to the other end of the serial connection of the memory cells MC0 to MC31.

Control gates of the memory cells MC in the NAND cell unit NU are connected to different word lines WL0 to WL31. The gates of the first and second selection gate transistors SG1 and SG2 are respectively connected to first and second selection gate lines SGD and SGS parallel to the word lines.

A set of memory cells MC sharing one word line WL composes one page as the unit for reading and writing data. A set of NAND cell units NU sharing the word lines WL1 to WL31 composes one block BLK as the unit for erasing the data.

As shown in FIG. 1, a row decoder 2 is disposed for selectively driving the word lines WL of the memory cell array 1, a sense amplifier/data latch 3 is connected to the bit line BL for reading and writing the data, and a column decoder 7 for selecting the bit line BL are disposed.

The sense amplifier/data latch 3 has sense units SAU for the portion of one page. Each sense unit SAU is shared by, for example, adjacent even-number bit line BLe and odd-number bit line BLo of the memory cell array 1. In this case, either one of the even-number bit line BLe and odd-number bit line BLo is selected by either one of bit line selection transistors Qe and Qo and is connected to the sense unit SU, and the other bit line is used as a shielding line.

A control circuit 4 decodes, operates and controls the command sent from outside through an I/O buffer 5. An address register 6 transfers the address sent from outside through the I/O buffer 5 to the row decoder 2 and the column decoder 7.

The page data read out by the sense amplifier/data latch 3 is controlled by the column decoder 7, and is output to outside through the I/O buffer 5.

The write data supplied from outside is transferred to the sense amplifier/data latch 3 by way of the I/O buffer 5 and the control circuit 4, and is written into the cell array 1 in the page unit.

An internal voltage generating circuit 8 is controlled by the control circuit 4, and boosts the supply voltage Vcc according to the operation, and generates an internal voltage Vout.

Figure 3:
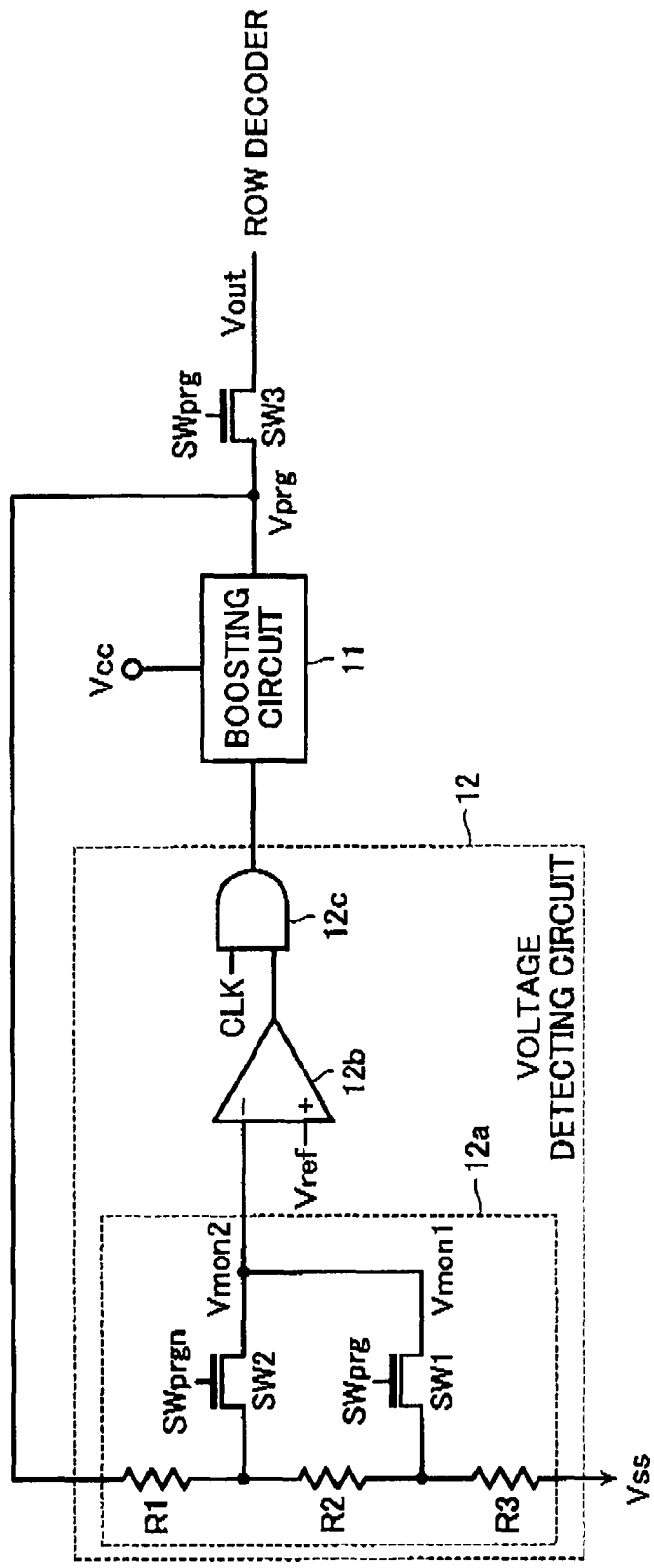
FIG. 3 is a structural diagram of an internal voltage generating circuit of the NAND type flash memory.

FIG. 3 shows a structure of the internal voltage generating circuit 8 of the NAND type flash memory according to the first embodiment. The internal voltage generating circuit 8 includes a boosting circuit 11 and a voltage detecting circuit (voltage limiter) 12.

The boosting circuit 11 is composed of a known charge pump circuit having a plurality of transfer stages.

The voltage detecting circuit 12 includes a series circuit of first, second and third resistances R1, R2 and R3 for dividing the output voltage Vprg of the boosting circuit 11, a resistance dividing circuit 12a composed of switching elements SW1 and SW2 for selecting the voltage dividing point of the series circuit, and a comparative amplifier 12b for comparing either one of divided first and second monitor voltages Vmon1 and Vmon2 with reference voltage Vref. The first monitor voltage Vmon1 appearing at the connection point of the second resistance R2 and the third resistance R3 is input into a negative input terminal of the comparative amplifier 12b by way of the switching element SW1. The second monitor voltage Vmon2 appearing at the connection point of the first resistance R1 and the second resistance R2 is input into the comparative amplifier 12b by way of the switching element SW2. The switching element SW1 is controlled to be turned on and off by switching element control signal SWprg activated in write operation mode. The switching element SW2 is controlled to be turned on and off by a switching element control signal SWprgn activated in write verify operation mode.

The comparative amplifier 12b makes an AND gate 12c active when the input monitor voltage Vmon1 or Vmon2 is lower than the reference voltage Vref. The AND gate 12c outputs a clock signal CLK to the boosting circuit 11 during the active period.

The boosting circuit 11 performs boosting operation by the input clock signal CLK, and outputs a boosted output voltage Vpreg. The boosting operation in the boosting circuit 11 continues until the monitor voltage Vmon1 or Vmon2 exceeds the reference voltage Vref.

The output voltage Vprg is output to the row decoder 2 by way of a switching element SW3 which is turned on by a switching element control signal SWprg in write operation mode.

Figure 4:
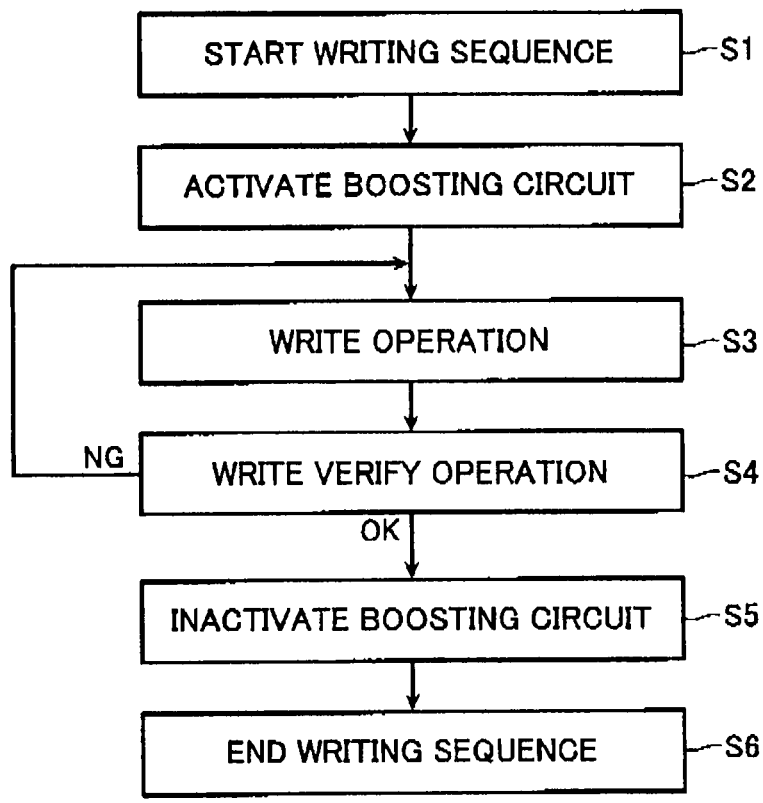
FIG. 4 is a data writing sequence diagram of the NAND type flash memory.

FIG. 4 shows the data writing sequence into the memory cell array 1 according to the embodiment.

The data is written into the memory cell MC by the write operation and the write verify operation for confirming the data write operation.

When the writing sequence is started (S1), first the boosting circuit 11 is activated, and the switching element control signal SWprg is turned to "H" (S2), and the boosting circuit 11 generates an output voltage Vprg boosted up to the level of writing voltage Vprg1, which is a first voltage necessary for writing data into the memory cell MC. The switching element SW3 remains in ON state, and thus the output voltage Vprg of the boosting circuit 11 is supplied to the word line WL of the memory cell array 1 through the row decoder 2 as output Vout of the internal voltage generating circuit 8. As a result, the write operation is performed (S3). The output voltage Vprg of the boosting circuit 11 is boosted by the resistance dividing circuit 12a to become the first monitor voltage Vmon1, and is fed back and supplied to the negative input terminal of the comparative amplifier 12b by way of the switching element SW1 in ON state. This monitor voltage Vmon1 is expressed as $(R3)/(R1+R2+R3)\times V$preg. In the comparative amplifier 12b, the specified reference voltage Vref and the monitor voltage Vmon1 are compared with each other, and when the monitor voltage Vmon1 is lower than the reference voltage Vref, the boosting circuit 11 is activated. As a result, the output voltage Vprg of the boosting circuit 11 maintains the level of the first voltage, that is, writing voltage Vprg1 $(=(R1+R2+R3)/R3\times V\text{ref})$.

In the next write verify operation (S4), since the switching element control signals SWprg and SWprgn are respectively "L" and "H", the switching element SW3 is in OFF state, and the output voltage Vprg of the boosting circuit 11 is not supplied to the row decoder 2. On the other hand, the output voltage Vprg of the boosting circuit 11 supplied to the resistance dividing circuit 12a is divided by the resistance dividing circuit 12a to become a second monitor voltage Vmon2, and is supplied to the negative input terminal of the comparative amplifier 12b by way of the switching element SW2 in ON state. At this time, the monitor voltage Vmon2 is higher than the monitor voltage Vmon1 in the write operation mode, and expressed as $(R2+R3)/(R1+R2+R3)\times V$prg. In the comparative amplifier 12b, the specified reference voltage Vref and the monitor voltage Vmon2 are compared with each other, and when the monitor voltage Vmon2 is lower than the reference voltage Vref, the boosting circuit 11 is activated. As a result, the output voltage Vprg of the boosting circuit 11 outputs a second voltage Vprg2 $(=(R1+R2+R3)/(R2+R3)\times V\text{ref})$, which is lower than the writing voltage Vprg1 as the first voltage. When all the memory cells MC have passed in the write verify operation, the boosting circuit is inactivated (S5), and the writing sequence is terminated (S6).

Figure 5:
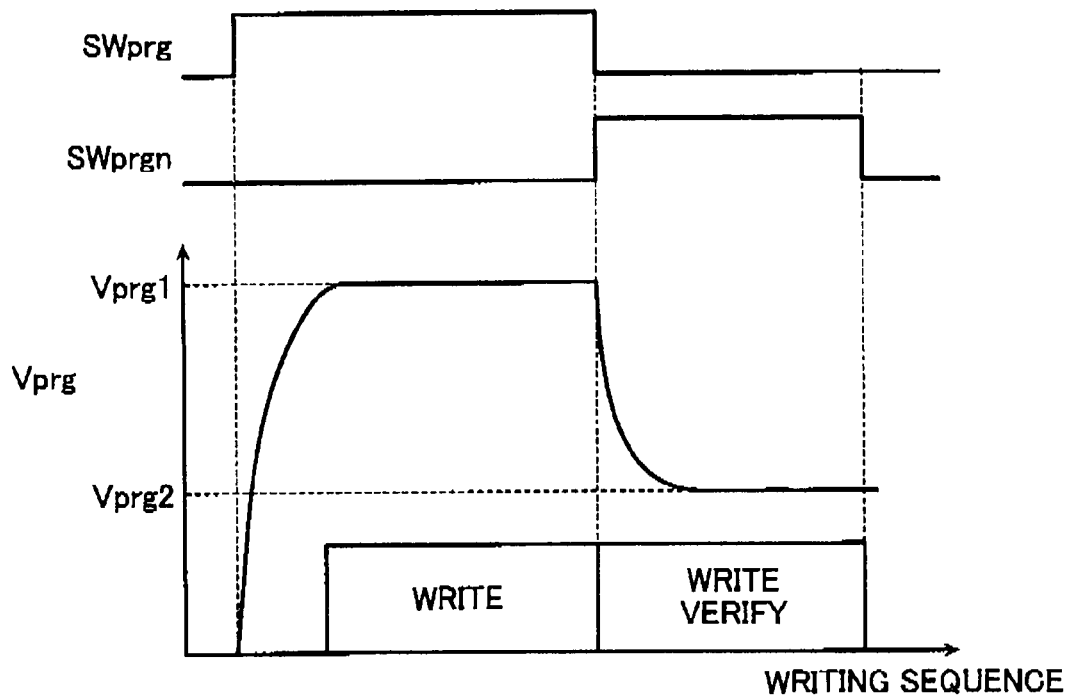
FIG. 5 is a graph showing the relationship between the writing sequence and the output voltage of the boosting circuit of the NAND type flash memory.

FIG. 5 is a graph showing the relationship between the writing sequence and the output voltage Vprg of the boosting circuit 11 of the NAND type flash memory according to the embodiment. According to the embodiment, as is clear from FIG. 5, since the voltage to be applied to the resistance dividing circuit 12a is decreased in the write verity operation, the value of the current flowing in the resistance dividing circuit 12a can be suppressed, and the current consumption is saved. Furthermore, since both the boosting circuit 11 and the voltage detecting circuit 12 are in active state in the writing sequence, the voltage returns to the writing voltage Vprg quickly.

Second Embodiment

Figure 6:
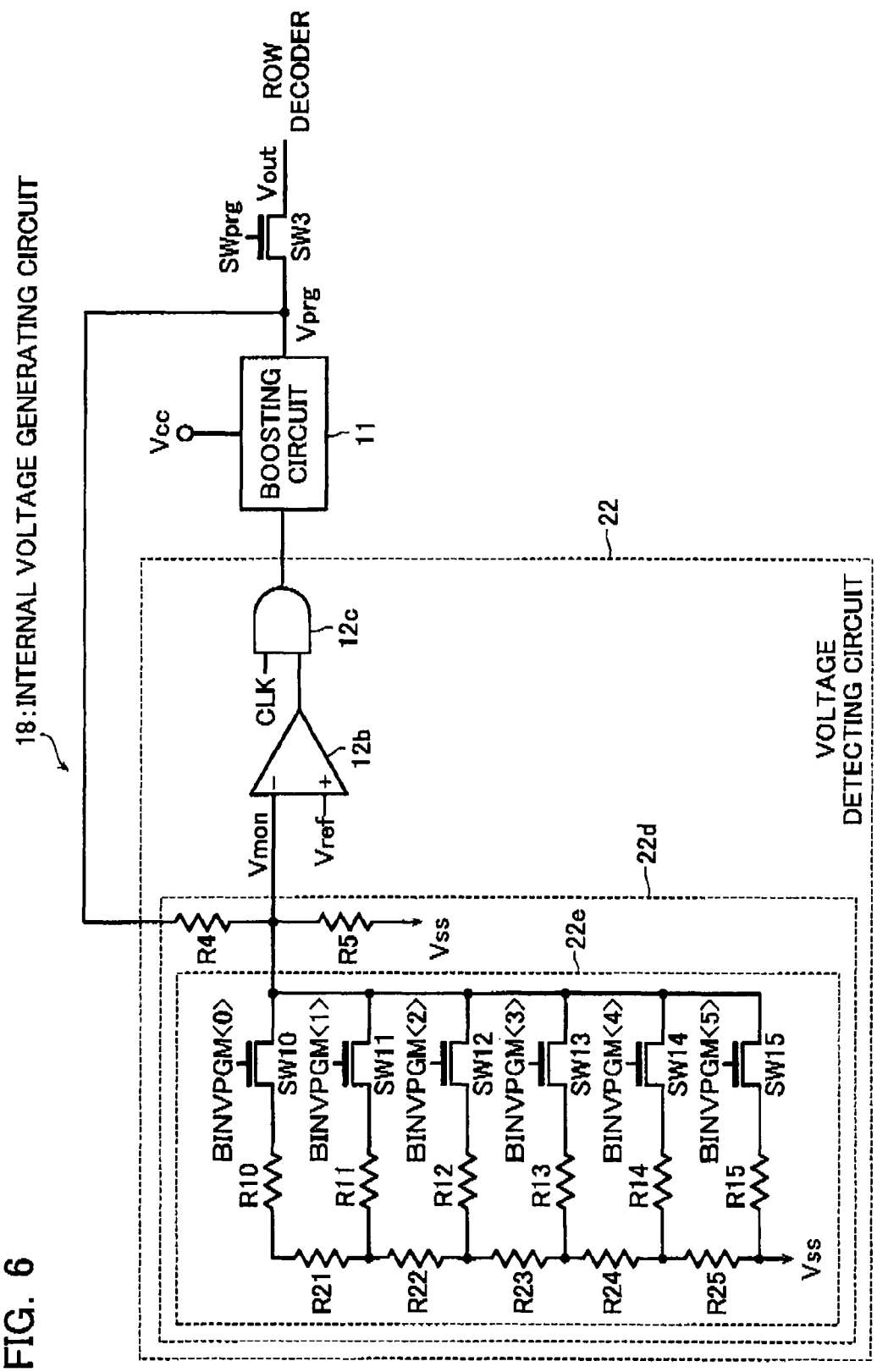
FIG. 6 is a structural diagram of an internal voltage generating circuit of a NAND type flash memory according to a second embodiment.

FIG. 6 is a structural diagram of an internal voltage generating circuit 18 of a NAND type flash memory according to a second embodiment. The entire configuration is the same as in the first embodiment.

This embodiment differs from the first embodiment in the configuration of the internal voltage generating circuit 18 and the writing sequence.

In this embodiment, a resistance dividing circuit 22d for composing a voltage detecting circuit 22 of the internal voltage generating circuit 18 is composed as follows. A resistance R4 is connected between an output end of a boosting circuit 11 and a negative input terminal of a comparative amplifier 12b. Between the comparative amplifier 12b and the grounding end, a parallel circuit of a resistance R5 and a ladder circuit 22e is connected. The ladder circuit 22e includes a series circuit of resistances R21 to R25, and series circuits of resistance Ri and switching element SWi (i=10 to 15) connected between the both ends and connection points of the series resistances R21 to R25 and the negative input terminal of the comparative amplifier 12b respectively. Depending on the combination of on/off state of these switching elements SW10 to SW15, the combined resistance of the ladder circuit 22e is adjusted, and the monitor voltage Vmon can be changed in a stepwise manner. Herein, a dividing ratio setting signal BINVPGM for on/off control of the switching elements SW10 to SW15 is a parameter given from a control circuit 4. This parameter is composed of a plurality of bits (six bits in the example in FIG. 6) assigned bit by bit each in the switching elements SW10 to SW15.

Figure 7:
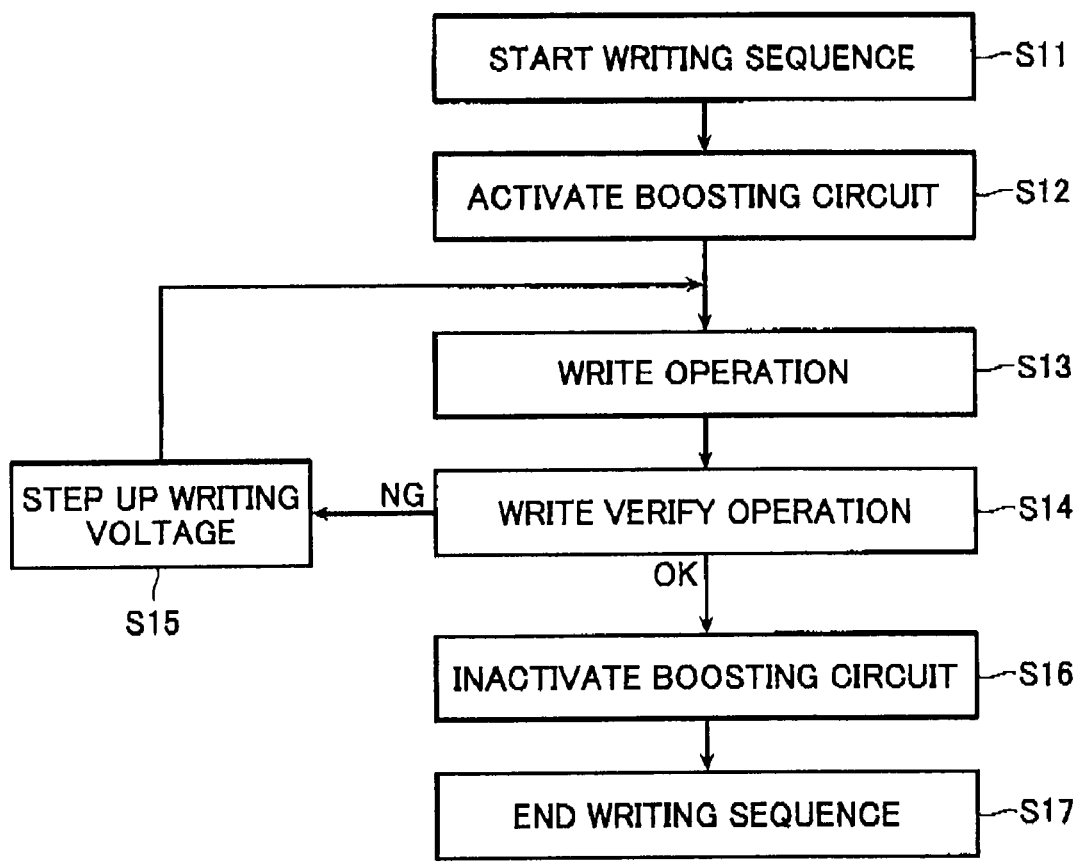
FIG. 7 is a data writing sequence diagram of the NAND type flash memory.

FIG. 7 shows a data writing sequence into the memory cell array 1 according to the embodiment.

When the writing sequence is started (S11), the boosting circuit 11 is activated (S12), and an output voltage Vprg is generated, which is boosted up to the level of a writing voltage Vprg1-1 as a first voltage necessary for writing data into the memory cell MC. Since a switching element SW3 is in ON state, the output voltage Vprg of the boosting circuit 11 is supplied to the word line WL of the memory cell array 1 by way of a row decoder 2 as output Vout of the internal voltage generating circuit 18. As a result, the write operation is performed (S13). The output voltage Vprg of the boosting circuit 11 is divided by the resistance dividing circuit 22d to become a monitor voltage Vmon, and is fed back and supplied to the negative input terminal of the comparative amplifier 12b. Thus, the output voltage Vprg of the boosting circuit 11 is maintained at the level of the first voltage Vprg1-1. Herein, the monitor voltage Vmon is determined by the dividing ratio of the resistance dividing circuit 22d determined by a dividing ratio setting signal BINVPRG <5:0> obtained from the control circuit 4. Assuming that the combined resistance of the ladder circuit 22e is RL, the monitor voltage Vmon is expressed as $(R5//RL)/(R4+(R5//RL))\times V$prg. For example, when the dividing ratio setting signal BINVPRG <5:0> is B'100010, the switching elements SW11 and SW15 are turned on, and the other switching elements are turned off, and thus the combined resistance RL of the ladder circuit 22e is $(R15//(R11+R22+R23+R24+R25))$.

In the next write verify operation (S14), the dividing ratio setting signal BINVPRG <5:0> is applied from the control circuit 4 so that the output voltage Vprg of the boosting circuit 11 is maintained at the second voltage Vprg2-1. This second voltage Vprg2-1 is a voltage of lower level than the first voltage Vprg1-1 in the previous write operation (S13). For example, when the dividing ratio setting signal BINVPRG <5:0> is B'000010, the combined resistance RL of the ladder circuit 22e is $(R11+R22+R23+R24+R25)$. In this case, as compared with the previous write operation (S13) in which the dividing ratio setting signal BINVPRG <5:0> is B'100010, the monitor voltage Vmon is higher in level, and therefore the output voltage Vprg of the boosting circuit 11 of the second voltage Vprg2-1 of lower level than the first voltage Vprg1-1 is maintained. In this state, it is verified whether or not data is written correctly in the memory cell MC (write verify operation) (S14).

As a result of verification, if data is not written in the memory cell MC normally, the dividing ratio setting signal BINVPRG <5:0> is applied from the control circuit 4 so as to maintain the level of the output voltage Vprg of the boosting circuit 11 at the first voltage Vprg1-2 higher than the previous first voltage Vprg1-1 (S15), and the write operation is performed again (S13). Thereafter, the dividing ratio setting signal BINVPRG <5:0> is applied from the control circuit 4 so as to maintain the level of the output voltage Vprg of the boosting circuit 11 at the second voltage Vprg2-2 lower than the first voltage Vprg1-2, and the write verify operation is performed (S14).

Thus, in the embodiment, the write operation (S13) and the write verify operation (S14) are repeated while stepping up the output voltage Vprg of the boosting circuit 11 (S15) until the data is normally written in the memory cell MC.

Finally, when it is verified that the data is normally written into the memory cell MC, the boosting circuit is inactivated (S16), and the writing sequence is terminated (S17).

According to the embodiment, the output voltage Vprg of the boosting circuit 11 can be adjusted finely without changing the reference voltage Vref.

By using the internal voltage generating circuit 8 of the embodiment, various writing sequences can be realized as follows.

Figure 8:
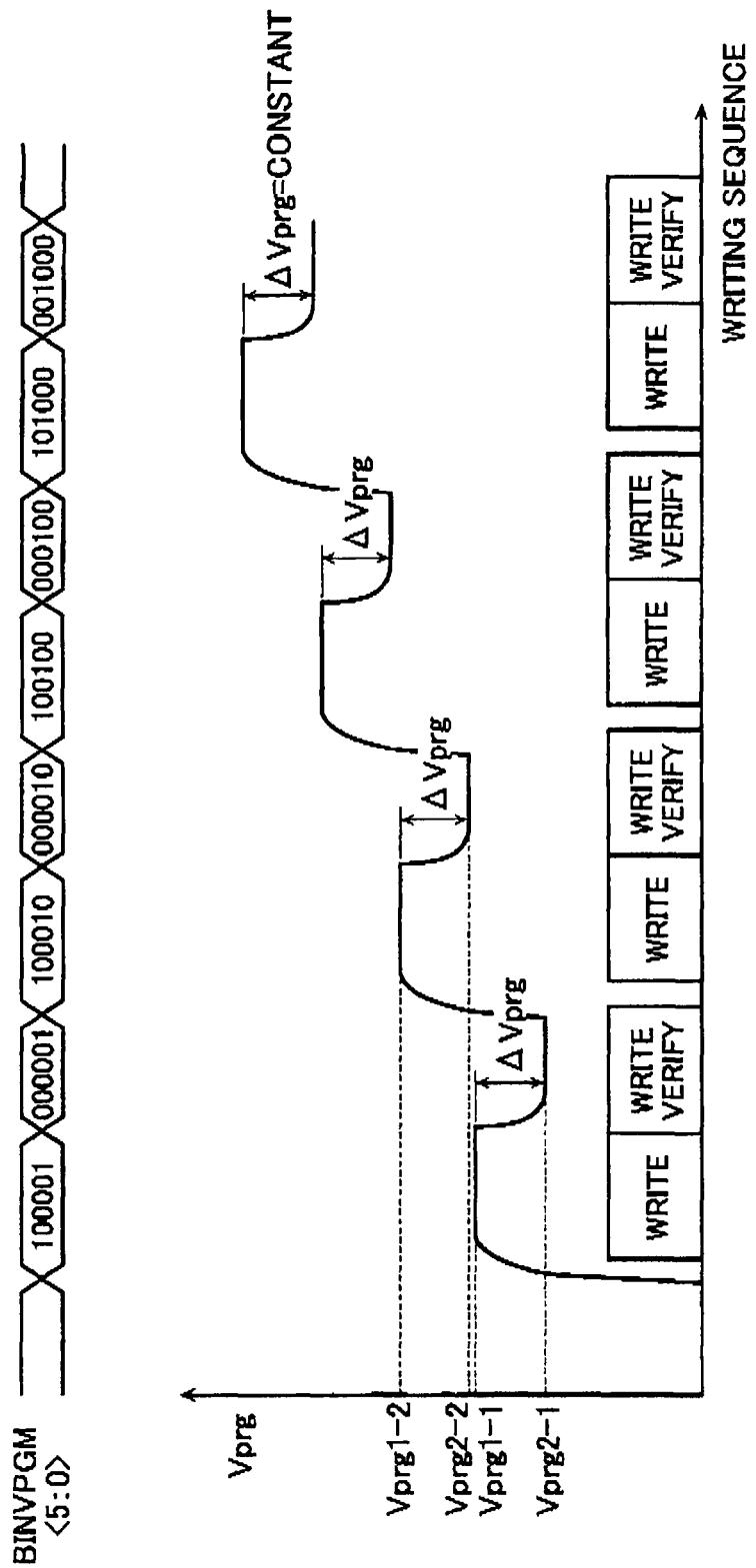
FIG. 8 is a graph showing an example of relationship between a writing sequence and a divided voltage ratio setting signal and an output voltage of a boosting circuit of a binary NAND type flash memory according to a third embodiment.
Figure 9:
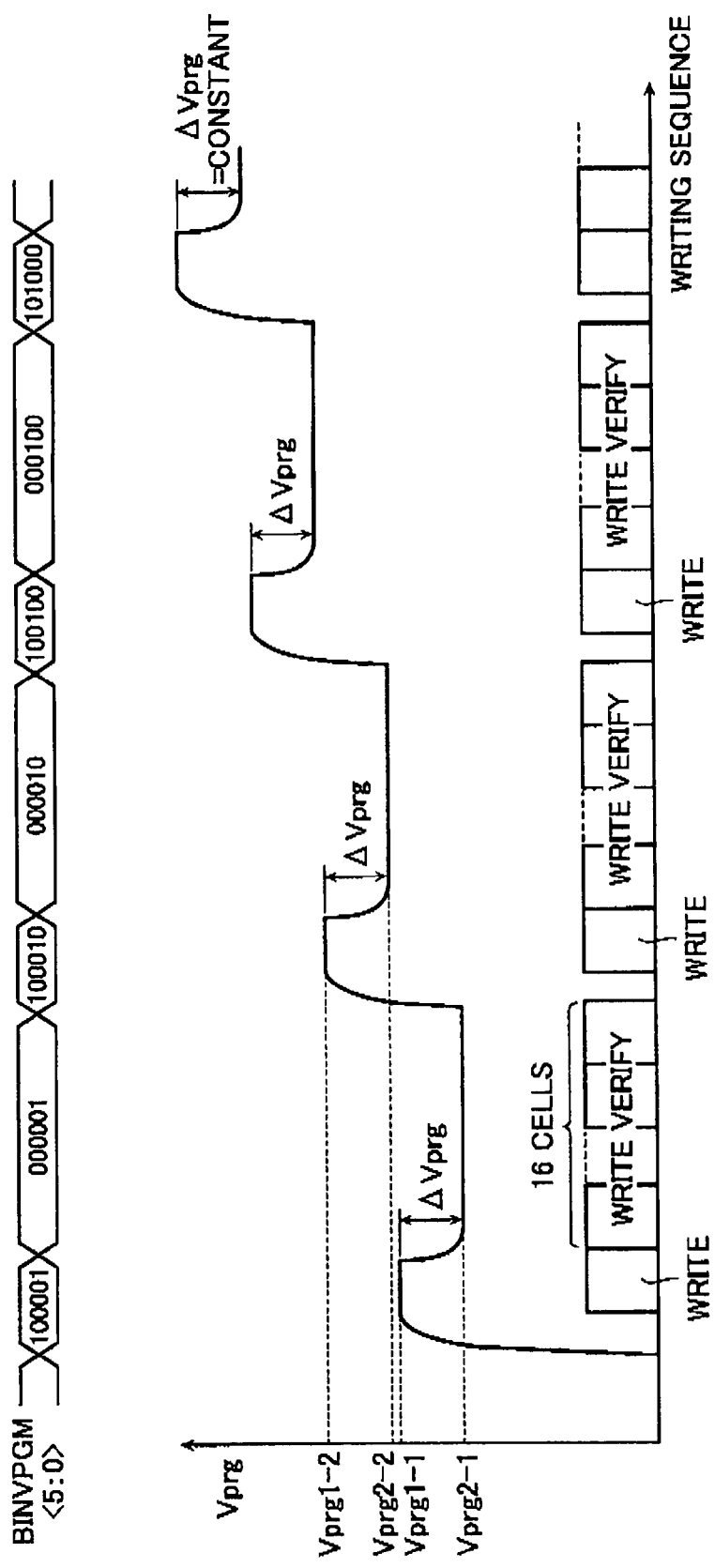
FIG. 9 is a graph showing an example of relationship between a writing sequence and a divided voltage ratio setting signal and an output voltage of a boosting circuit of a multi-level NAND type flash memory according to a fourth embodiment.
Figure 10:
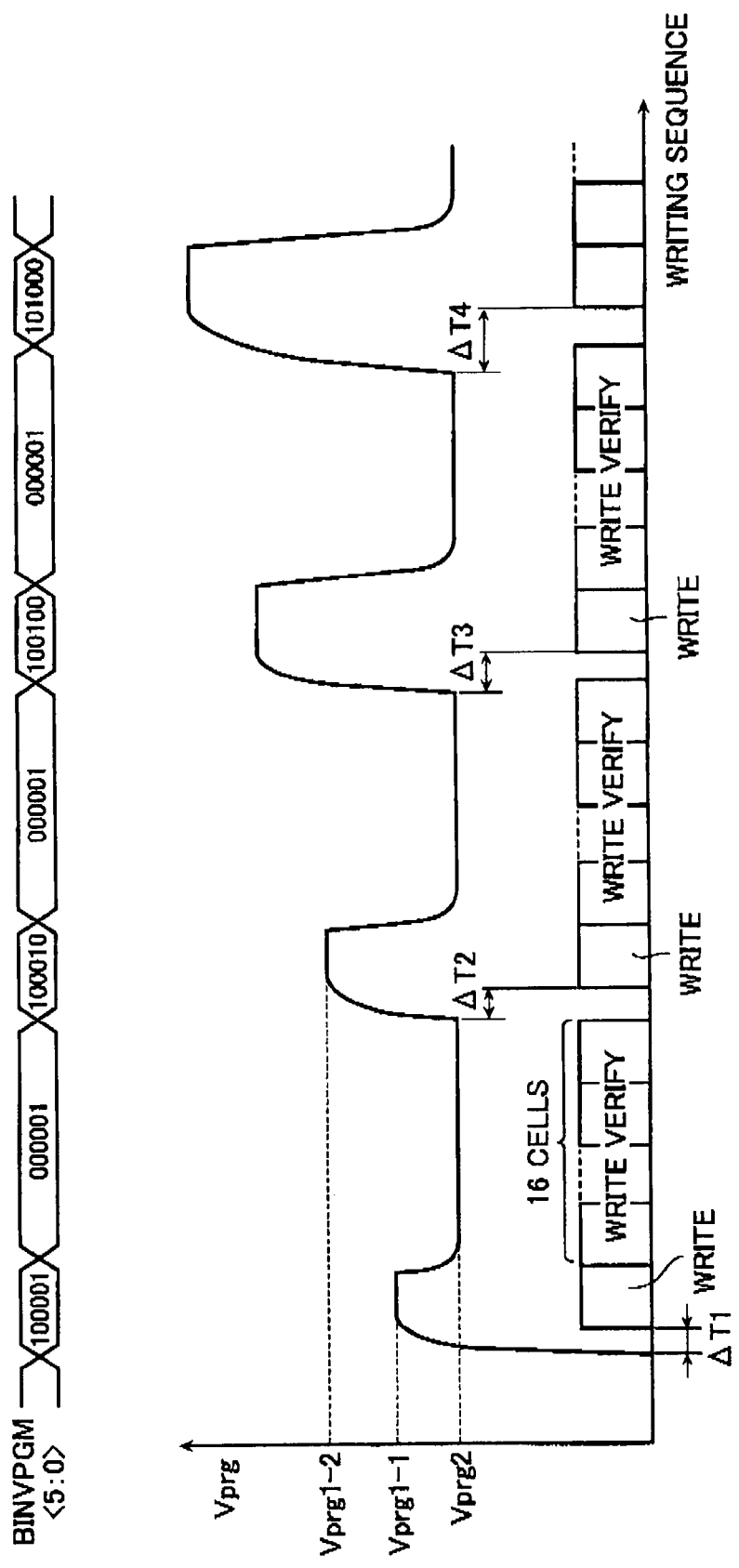
FIG. 10 is a graph showing another example of relationship between a writing sequence and a divided voltage ratio setting signal and an output voltage of a boosting circuit of a binary NAND type flash memory according to a fifth embodiment.

FIGS. 8, 9 and 10 are graphs showing the relationship between the writing sequence and the dividing ratio setting signal BINVPGM <5:0> and the output voltage Vprg of the boosting circuit 11 in third to fifth embodiments, respectively.

Third Embodiment

FIG. 8 shows the writing sequence of a binary NAND type flash memory according to a third embodiment.

In this embodiment, one step consists of one write operation (S33) and one write verify operation (S14), and this step is repeated while elevating the output voltage Vprg of the boosting circuit 11 gradually at specific levels until the data is written correctly in the memory cell MC. Herein, when the difference ΔVprg between first and second voltages of the output voltage Vprg of the boosting circuit 11 in the write operation (S13) and write verify operation (S14) at each step is constant, the difference between the second voltage in the write verify operation (S14) at the previous step and the first voltage in the write operation at the next step is constant. By thus controlling the output voltage Vprg of the boosting circuit 11, the rise time is constant in the output voltage Vprg of the boosting circuit 11 when elevating from the second voltage in the write verify operation (S14) at the previous step to the first voltage in the write operation (S13) at the next step. Hence, the starting timing of the write operation (S13) and the write verify operation (S14) can be kept constant, and timing adjustment at each step is not needed.

Fourth Embodiment

FIG. 9 shows the writing sequence of a multilevel NAND type flash memory according to a fourth embodiment.

As in the third embodiment shown in FIG. 8, this embodiment is intended to control the output voltage Vprg of the boosting circuit 11 so as to keep constant the difference ΔVprg between first and second voltages of the output voltage Vprg of the boosting circuit 11 in the write verify operation (S14) at the preceding step and the write operation (S13) at next step. In the multilevel NAND type flash memory, for example, in the case of a hexadecimal NAND type flash memory, data writing at a threshold level of 16 values is needed. Hence, the write verify operation (S14) is repeated 16 times at every step. That is, the rate of the write verify operation (S14) period in the entire writing sequence is larger, and as compared with the binary NAND type flash memory, the consumption current saving effect is greater.

Fifth Embodiment

FIG. 10 shows the writing sequence of a multilevel NAND type flash memory according to a fifth embodiment.

In this embodiment, the output voltage Vprg of the boosting circuit 11 as the first voltage in the write operation (S13) at each step is increased by a predetermined level gradually, while the output voltage Vprg of the boosting circuit 11 in the write verify operation (S14) remains constant at the level of the second voltage Vprg2. In the embodiment, as compared with the fourth embodiment shown in FIG. 9, the consumption current in the write verify operation (S14) can be suppressed much more. In this case, the time required for elevating the output voltage Vpreg of the boosting circuit 11 to the first voltage in the write operation (S13) of the next step from the second voltage at the write verify operation (S14) at the previous step becomes longer as the steps are repeated like ΔT1, ΔT2, ΔT3, ΔT4. However, by accelerating the rise timing of the first voltage Vprg1, that is, the transfer timing of the dividing ratio setting signal BINVPGM <5:0> by the control signal 4, at each step, the timing of elevating the supply voltage Vcc to the first voltage level can be adjusted.

What is claimed is:

1. A semiconductor integrated circuit device comprising:
   a memory cell array composed of electrically rewritable memory cells;
   an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage;
   a control circuit for controlling the internal voltage generating circuit; and
   a writing circuit for applying the internal voltage to the memory cell as a writing voltage when writing data into the memory cell,
   wherein the control circuit controls the internal voltage to a first voltage necessary for writing data into the memory cell when writing data into the memory cell, and to a second voltage lower than the first voltage in a write verify operation following the data write operation, executes a writing sequence including data write operation into the memory cell and a subsequent write verify operation plural times consecutively, and increases the first voltage more in the subsequent writing sequence than in the previous writing sequence.

2. The semiconductor integrated circuit device according to claim 1, wherein the voltage detecting circuit has a dividing circuit of variable voltage dividing ratio having resistances connected in series between an output terminal for outputting the output voltage of the boosting circuit and a ground, and the output of the dividing circuit is a monitor voltage.

3. The semiconductor integrated circuit device according to claim 1, wherein a difference between the first and second voltages of the writing sequence is constant individually.

4. The semiconductor integrated circuit device according to claim 1, wherein the second voltage is constant.

5. The semiconductor integrated circuit device according to claim 1, wherein the writing sequence includes two or more write verify operations.

6. The semiconductor integrated circuit device according to claim 1, wherein the internal voltage generating circuit is activated from start till end of the writing sequence.

7. The semiconductor integrated circuit device according to claim 2, wherein the control circuit outputs a parameter to the dividing circuit for determining the dividing ratio, the dividing circuit has a plurality of switching elements for determining the dividing ratio, and the plurality of switching elements are turned on or off by the parameter given from the control circuit to vary the dividing ratio, thereby controlling the first and second voltages variably.

8. The semiconductor integrated circuit device according to claim 1, wherein the control circuit executes the data write operation to the memory cell and the subsequent write verify operation plural times consecutively while stepping up the writing voltage, and controls the first and second voltages so that a rising timing from the second voltage to the first voltage in the later data write operation is faster than a rising timing from the second voltage to the first voltage in the previous data write operation.

9. A semiconductor integrated circuit device comprising:
a memory cell array composed of electrically rewritable memory cells;
an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage;
a control circuit for controlling the internal voltage generating circuit; and
a writing circuit for applying the internal voltage to the memory cell as a writing voltage when writing data into the memory cell,
wherein the control circuit activates the internal voltage generating circuit from start till end of data writing into the memory cell, and controls the internal voltage to a first voltage necessary for writing data into the memory cell, and to a second voltage lower than the first voltage in a write verify operation following the data write operation, executes the data write operation into the memory cell and the subsequent write verify operation plural times consecutively, and increases the first voltage more in the later data write operation than in the previous data write operation, and also increases the second voltage so that a difference between the first and second voltages is constant.

10. The semiconductor integrated circuit device according to claim 9, wherein the voltage detecting circuit has a dividing circuit of variable voltage dividing ratio having a resistance connected in series between an output terminal for outputting the output voltage of the boosting circuit and a ground, and the output of the dividing circuit is a monitor voltage.

11. The semiconductor integrated circuit device according to claim 10, wherein the control circuit outputs a parameter to the dividing circuit for determining the dividing ratio, the dividing circuit has a plurality of switching elements for determining the dividing ratio, and the plurality of switching elements are turned on or off by the parameter given from the control circuit to vary the dividing ratio, thereby controlling the first and second voltages variably.

12. The semiconductor integrated circuit device according to claim 9, wherein the control circuit executes the data write operation to the memory cell and the subsequent write verify operation plural times consecutively while stepping up the writing voltage, and controls the first and second voltages so that a rising timing from the second voltage to the first voltage in the later data write operation is faster than a rising timing from the second voltage to the first voltage in the previous data write operation.

13. A semiconductor integrated circuit device comprising:
a memory cell array composed of a plurality of memory cells electrically rewritable and capable of storing multilevel data according to a difference in a threshold voltage;
an internal voltage generating circuit having a boosting circuit for generating a voltage boosted from a supply voltage, and a voltage detecting circuit for detecting an output voltage of the boosting circuit as a monitor voltage and controlling on/off of the boosting circuit for holding the output voltage of the boosting circuit at a specified level, the internal voltage generating circuit outputting the output voltage of the boosting circuit as an internal voltage;
a control circuit for controlling the internal voltage generating circuit; and
a writing circuit for applying the internal voltage to the memory cell as a writing voltage when writing data into the memory cell,
wherein the control circuit controls the internal voltage to a first voltage necessary for writing data into the memory cell when writing data into the memory cell, and to a second voltage lower than the first voltage in a write verify operation following the data write operation, executes a writing sequence consisting of data write operation into the memory cell and the subsequent write verify operation plural times consecutively, and increases the first voltage more in the subsequent writing sequence than in the previous writing sequence, and also increases the second voltage so that a difference between the first and second voltages is constant.

14. The semiconductor integrated circuit device according to claim 13, wherein the voltage detecting circuit has a dividing circuit of variable voltage dividing ratio having a resistance connected in series between an output terminal for outputting the output voltage of the boosting circuit and a ground, and the output of the dividing circuit is a monitor voltage.

15. The semiconductor integrated circuit device according to claim 14, wherein the control circuit outputs a parameter to the dividing circuit for determining the dividing ratio, the dividing circuit has a plurality of switching elements for determining the dividing ratio, and the plurality of switching elements are turned on or off by the parameter given from the control circuit to vary the dividing ratio, thereby controlling the first and second voltages variably.

16. The semiconductor integrated circuit device according to claim 13, wherein the control circuit executes the data write operation to the memory cell and the subsequent write verify operation plural times consecutively while stepping up the writing voltage, and controls the first and second voltages so that a rising timing from the second voltage to the first voltage in the later data write operation is faster than a rising timing from the second voltage to the first voltage in the previous data write operation.

17. The semiconductor integrated circuit device according to claim 13, wherein the internal voltage generating circuit is activated from start till end of the writing sequence.

* * * * *